United States Patent
Burkhart

(10) Patent No.: US 6,255,601 B1
(45) Date of Patent: *Jul. 3, 2001

(54) CONDUCTIVE FEEDTHROUGH FOR A CERAMIC BODY AND METHOD OF FABRICATING SAME

(75) Inventor: Vince Burkhart, San Jose, CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/834,702

(22) Filed: Apr. 1, 1997

(51) Int. Cl.$^7$ .................................................. H01R 23/68
(52) U.S. Cl. ......................... 174/262; 174/255; 174/261; 174/267
(58) Field of Search .................................. 174/250, 255, 174/262, 265, 267, 151, 10, 11 BH, 12 BH, 50.51, 50.52, 50.57, 50.6, 50.61, 152 E, 152 GM, 261; 361/234, 230, 231, 232, 233, 235; 279/128

(56) References Cited

U.S. PATENT DOCUMENTS

| | | | |
|---|---|---|---|
| 3,346,689 | * 10/1967 | Parstorfer | 174/265 |
| 4,095,866 | * 6/1978 | Merrill | 174/262 X |
| 4,320,438 | * 3/1982 | Ibrahim et al. | |
| 4,665,468 | 5/1987 | Dohya | 361/794 |
| 5,110,654 | 5/1992 | Yokokawa | 428/137 |
| 5,136,238 | * 8/1992 | Kade | |
| 5,155,652 | 10/1992 | Logan et al. | 361/234 |
| 5,191,506 | 3/1993 | Logan et al. | 361/234 |
| 5,450,290 | * 9/1995 | Boyko et al. | 174/262 X |
| 5,730,803 | * 3/1998 | Steger et al. | 118/723 R |
| 5,886,863 | * 3/1999 | Nagasaki et al. | 361/234 |

FOREIGN PATENT DOCUMENTS

| | | | |
|---|---|---|---|
| 2649829 | 1/1991 | (FR) | |
| 0753875 | * 8/1956 | (GB) | 174/265 |
| 1138673 | 1/1969 | (GB) | |
| 60-083356 | 9/1985 | (JP) | |
| 62-286249 | 12/1987 | (JP) | |
| 1-207992 | * 8/1989 | (JP) | 174/250 |
| 3-163849 | 7/1991 | (JP) | |

OTHER PUBLICATIONS

R. Cechanek, Multilayer Printed–Circuit Boards, IBM Technical Disclosure Bulletin, vol. 20 No. 11B, Apr. 1978, pp 4726–4727.*

* cited by examiner

Primary Examiner—Albert W. Paladini
(74) Attorney, Agent, or Firm—Thomason, Moser & Patterson, L.L.P.

(57) ABSTRACT

A conductive feedthrough connector for conducting electrical current through a ceramic body. A ceramic body is generally fabricated by stacking a plurality of layers of ceramic material and then sintering the stack of layers to cure the layers into a unitary, solid ceramic body. In accordance with the present invention, as each layer is positioned, a portion of the layer is silk screened with conductive material prior to the next layer being positioned atop the silk screened layer. Each silk screen region is coaxially aligned along an axis through the ceramic body. The stack of silk screened layers are then sintered to form a solid ceramic body containing the plurality of stacked metal electrodes. A first conductor is then formed vertically into the ceramic body to interconnect the embedded electrodes. From the opposite side of the ceramic body, a second conductor is formed into the surface passing through and interconnecting one or more the layers of electrodes. As such, a conductive path is formed between the first conductor on one side of the ceramic body and the second conductor on the other side of the ceramic body.

18 Claims, 2 Drawing Sheets

CONDUCTIVE FEEDTHROUGH FOR A CERAMIC BODY AND METHOD OF FABRICATING SAME

BACKGROUND OF THE DISCLOSURE

1. Field of the Invention

The present invention relates to semiconductor wafer processing equipment and, more particularly, to a conductive feedthrough extending from volume containing atmospheric pressure through a ceramic body into a vacuum chamber.

2. Description of the Background Art

A semiconductor wafer processing system generally contains a vacuum chamber within which is mounted a wafer support pedestal or susceptor. The pedestal is used to support the wafer within the chamber during processing. The pedestal contains various components which provide heating and/or cooling of the wafer as well as clamping (chucking) of the wafer to retain the wafer in a stationary position upon the pedestal surface. Such clamping is provided by either a mechanical clamp or an electrostatic chuck. Within the vacuum chamber, the space above the pedestal where the wafer is processed is generally maintained at a high vacuum. However, the space below or inside the pedestal is maintained at atmospheric pressure.

For high-temperature reactions, such as high temperature physical vapor deposition, the pedestal is fabricated of ceramic. Heretofore, there has not been a convenient nor practical solution for providing an electrically conductive, yet vacuum sealed, connection through a ceramic pedestal such that electrical current can be passed from the atmosphere side of the pedestal to the vacuum side of the pedestal without violating the integrity of the vacuum.

Therefore, there is a need in the art for apparatus that provides a conductive feedthrough connection through a ceramic body, such as a ceramic pedestal, and a method of fabricating the feedthrough.

SUMMARY OF THE INVENTION

The disadvantages heretofore associated with the prior art are overcome by the present invention of a conductive feedthrough connector for facilitating the flow of electrical current through a ceramic body. Specifically, ceramic bodies such as ceramic support pedestals are generally fabricated by stacking a plurality of layers of ceramic material (e.g., aluminum-nitride, alumina, and the like) and then sintering the stack of layers to cure the layers into a unitary, solid ceramic body. In accordance with the present invention, as each layer is positioned upon the stack, a portion of a select number of layers is silk screened with a conductive material (tungsten alloy) prior to the next layer being positioned atop the silk screened layer. Each silk screened region is coaxially aligned along a vertical axis through the ceramic body within another conductive region of another layer. The stack of silk screened layers are then sintered to form a solid ceramic body containing a plurality of stacked conductive electrodes.

Conductive vias are then formed vertically into one surface of the ceramic body to intersect the embedded electrodes. These vias are formed by drilling, bead blasting, etching, or some other process used to generate bores in the ceramic body. Using a physical vapor deposition (PVD), chemical vapor deposition (CVD) or other means of metal deposition, the vias are filled with a conductive material such that the embedded electrodes are interconnected by one or more vertical conductive vias. A top end of the vias are exposed by lapping the surface of the ceramic body. As such, electrodes and other conductors can be sputtered onto the surface of the ceramic body and connect to the exposed ends of the vias.

From the opposite side of the ceramic body (i.e., the side not containing the conductive vias), a bore is formed into the surface of the ceramic body passing through (intersecting) one or more of the layers of electrodes. An electrical connector pin is then braised into this bore such that the pin conductively connects to the intersected layers of electrode. As such, a conductive path is formed between the conductive vias on one side of the ceramic body (e.g., the vacuum side) and the electrical connector on the other side of the ceramic body (e.g., the atmosphere side). This feedthrough is completely vacuum-sealed and permits a variety of electrical connections to be made to the feedthrough on the vacuum side of the ceramic body.

Alternatively, two or more conductive electrode stacks can be fashioned in various, laterally disparate, locations in the ceramic body. These electrode stacks are laterally interconnected with one another through conductive traces deposited (silk screened) between the ceramic layers.

In one illustrative application for the invention, the inventive feedthrough is used in a PVD system where the ceramic body is a Johnsen-Rahbek electrostatic chuck, and the feedthrough connector of the present invention provides current to a surface electrode located on the vacuum side of the chuck.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
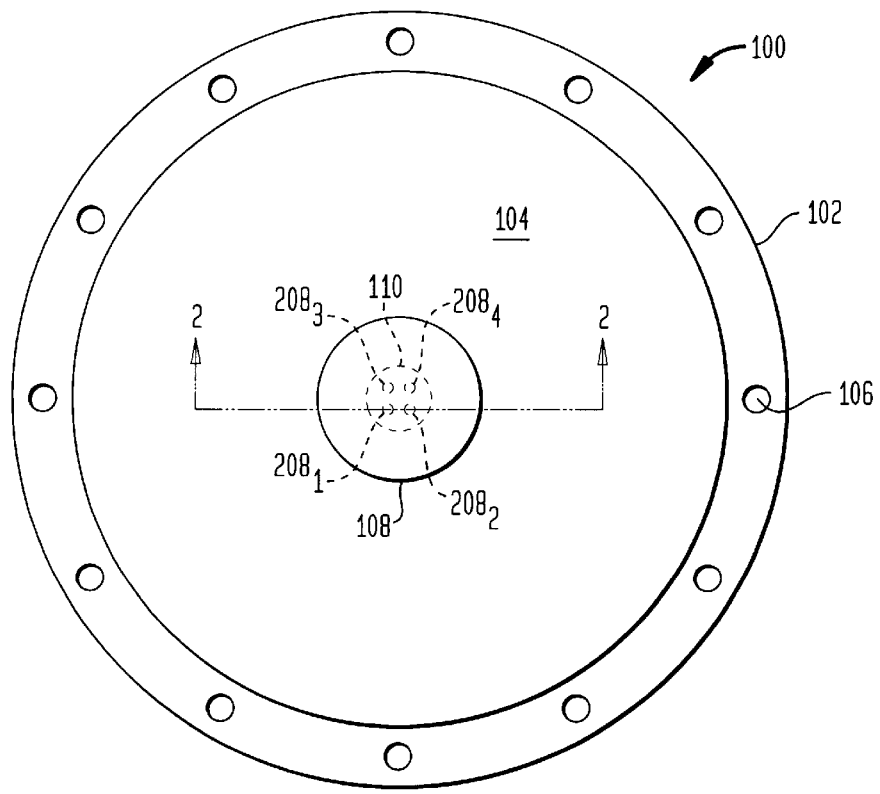
FIG. 1 is a top view of a ceramic wafer support pedestal containing the present invention.

FIG. 1 depicts a top plan view of an illustrative ceramic body containing the feedthrough of the present invention. In this illustrative example, the ceramic body is a ceramic wafer support pedestal, e.g., a Johnsen-Rahbek electrostatic chuck, for a semiconductor wafer processing system such as a physical vapor deposition system. However, those skilled in the art will realize from the following disclosure that the inventive feedthrough finds use in any application of a ceramic body where a conductive feedthrough is necessary.

Pedestal 100 contains a circumferential mounting flange 102 having a plurality of mounting bores 106. The support surface 104 of the pedestal 100 has illustratively affixed thereto an electrode 108. Although a single, centrally-located electrode is shown to illustrate one application of the invention, a multitude of electrodes may be affixed to the surface, or no electrode at all may be used and a feedthrough 110 may be positioned to supply electrical current to diagnostic equipment within a vacuum chamber. In the example shown, the feedthrough 110 of the present invention connects the vacuum side of the pedestal, e.g., the side that supports the wafer, to the atmosphere side of the pedestal.

Figure 2:
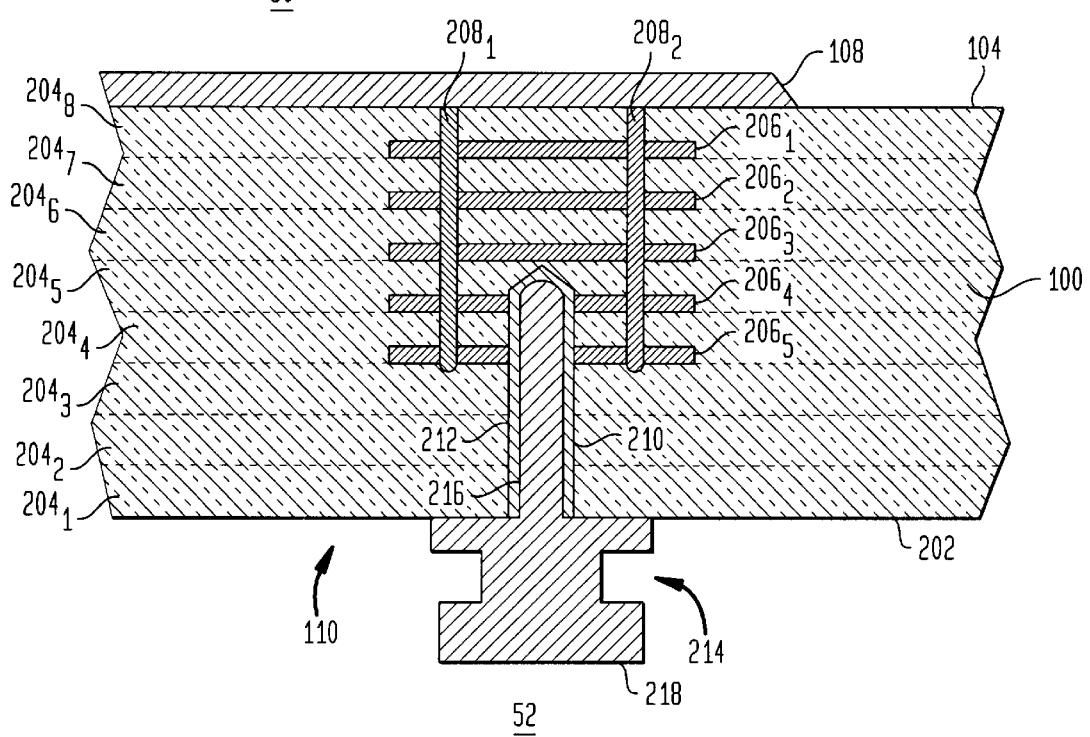
FIG. 2 is a cross-section of a portion of the ceramic wafer support pedestal taken along lines 2—2 of FIG. 1.

FIG. 2 depicts a cross-sectional view of a portion of the pedestal 100 taken along 2—2 of FIG. 1. This first embodiment of the invention is a single, vertical feedthrough 110 that conductively connects the vacuum side 50 of the pedestal 100 to the atmosphere side 52 of the pedestal 100. Illustratively, this feedthrough is supplying power to a conductive electrode positioned on the vacuum side of the pedestal, i.e., the electrode 108 affixed to surface 104. The atmosphere side 52 of the pedestal is located below surface 202 of the pedestal 100.

The feedthrough 110 contains a plurality of conductive layers 206 (e.g., $206_1$, $206_2$, $206_3$, $206_4$, and $206_5$) arranged vertically within the ceramic body and interconnected by a plurality of vias 208 (e.g., $208_1$, $208_2$, $208_3$ and $208_4$). The atmosphere side 52 is connected to the electrodes 206 by a bore 210 and a conductive pin 214 that is braised into the bore such that the pin electrically connects to one or more of the electrode layers 206.

More specifically, the ceramic body, represented by the pedestal 100, is fabricated of a plurality of stacked layers of ceramic material $204_1$, $204_2$, $204_3$ . . . $204_8$. During the layering process, the layers of ceramic material are "dough-like" and are easily cut and shaped into a desired form. During fabrication, as each layer of ceramic material (e.g., titanium nitride (TiN)) is positioned atop the next, the electrodes 206 are silk screened upon selected layers. The silk screened regions are formed in a vertical stack as each of the ceramic layers are positioned. The silk screened regions are generally coaxially aligned along a vertical axis through the stack of ceramic layers. Generally, the electrodes are fabricated of a tungsten alloy that, when sintered, solidifies into a tungsten electrode. Once the stack of silk screened ceramic layers is complete, the stack is dewaxed to bake out any hydrocarbons in the ceramic material. Then, the stack is cured by sintering the ceramic layers at approximately 2000° C. within a nitrogen atmosphere.

Once cured, one or more conductive vias (e.g., four vias) are vertically formed into the vacuum side 50 of the ceramic body 100. These vias 208 (specifically $208_1$, $208_2$, $208_3$, and $208_4$) are generally created by boring a hole in the ceramic body such that the hole passes through the plurality of ceramic layers 204 and through a plurality of electrodes 206. These bores are formed in the ceramic using conventional boring techniques such as bead blasting, drilling, etching and the like. Once the holes are formed, the vias are completed by depositing a conductive material (e.g., a tungsten alloy) into the holes to interconnect the electrodes 206. Such deposition is accomplished using conventional techniques such as physical vapor deposition (PVD), chemical vapor deposition (CVD), or other means of depositing metals. After depositing the conductive material, the surface 104 of the ceramic body 100 is lapped to expose the top end of the vias. Once exposed, a conductive layer 108 can be sputtered on the surface 104. The exposed vias bond with the conductive layer 108. Alternatively, wires, current probes, and other electrical circuitry can be connected to the exposed vias.

To complete the feedthrough 110, a bore 210 is formed into the surface 202 on the atmosphere side 52 of the ceramic body 100. A shaft 216 of a conductive pin 218 is then braised into the bore 210 such that the pin is in conductive contact with one or more of the electrodes 206. As such, the conductive via 208 is electrically connected to the pin 218 and provides a conductive path through the ceramic body.

The vias 208 are then be connected to, for example, an electrode 108 that is affixed to the surface 104 of the pedestal 100. As such, electric power can be applied to the atmosphere side of the ceramic body, and the power is carried through the feedthrough to the electrode 108.

Although the first illustrative embodiment of the invention depicts a pin connector on the atmosphere side of the ceramic body and the via connector on the vacuum side of the ceramic body, obviously the pin connector could be used on the vacuum side and the via connector used on the atmosphere side. Furthermore, a feedthrough may also be constructed having pin connectors on both sides of the ceramic body or a via connector on both sides of the ceramic body.

Figure 3:
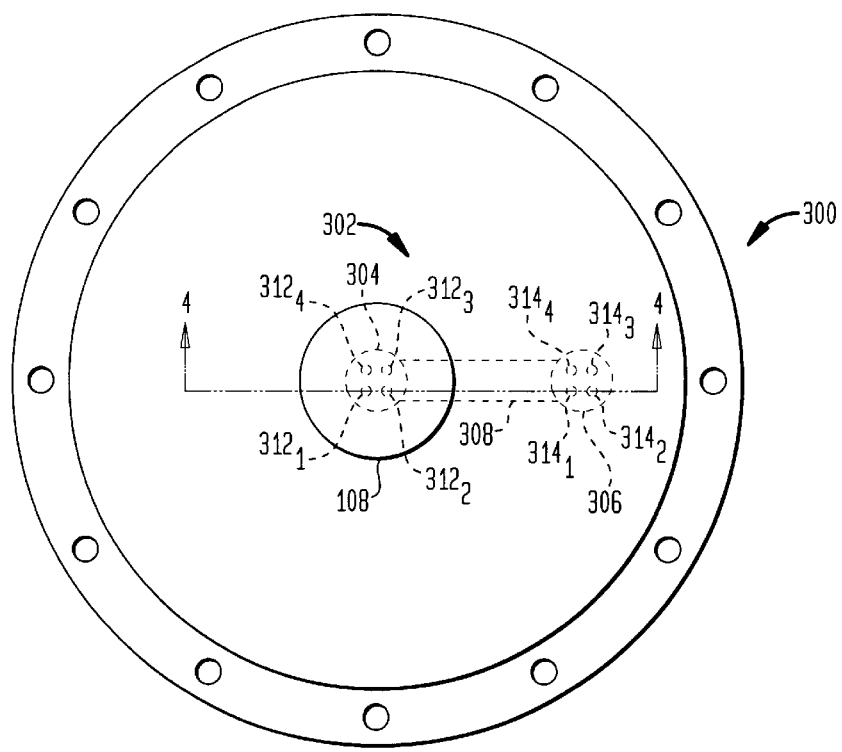
FIG. 3 is a top view of a ceramic wafer support pedestal containing an alternative embodiment of the present invention.

FIG. 3 depicts a top plan view of an alternative embodiment of the present invention. This embodiment contains a ceramic body 300 (e.g., a ceramic wafer support pedestal) with a feedthrough 302 electrically connecting a vacuum side 400 to an atmosphere side 402 of the ceramic body 300. Rather than a linear (vertical) connection from a pin to an electrode, this embodiment of the invention has the location of the pin connector 306 laterally offset from the location of the via connector 304. Specifically, a centrally located electrode 108 affixed to the support surface of the pedestal 100 is connected through an offset feedthrough 302 to the atmosphere side 402 of the pedestal.

Figure 4:
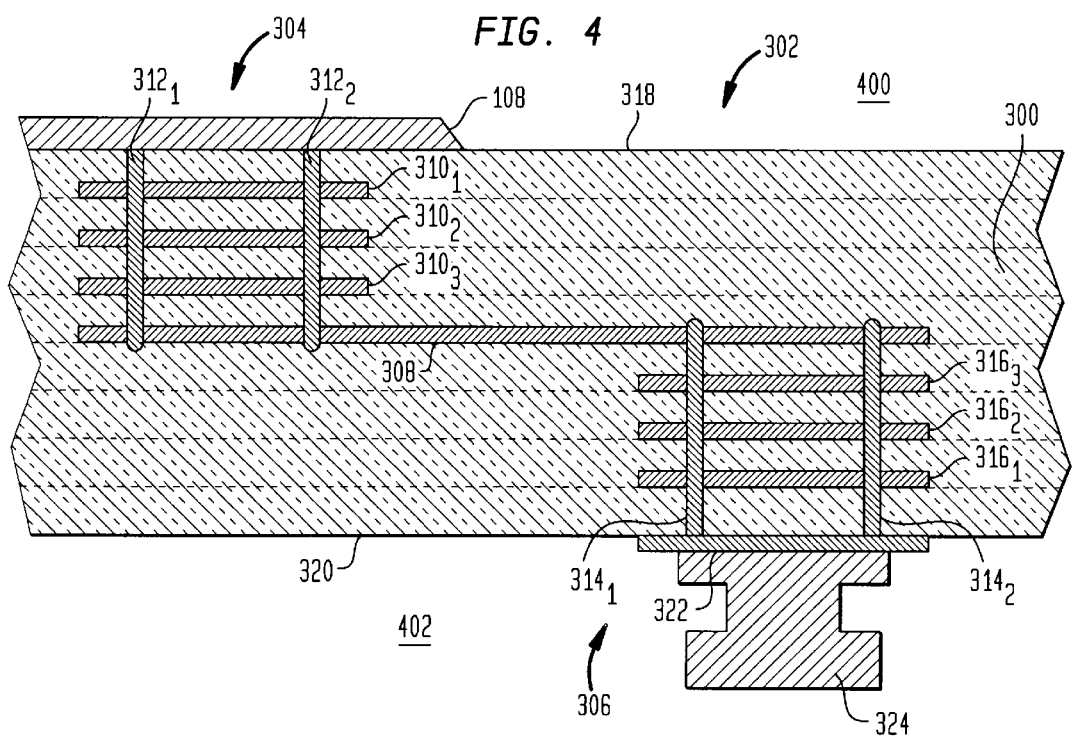
FIG. 4 is a cross-section of a portion of the ceramic wafer support pedestal taken along lines 4—4 of FIG. 3.

FIG. 4 depicts a cross-sectional view of the alternative embodiment taken along line 4—4 of FIG. 3. In this embodiment, the offset feedthrough 302 contains a pair of partial feedthroughs 304 and 306. These partial feedthroughs are laterally distant from one another and interconnected by a bus electrode 308. In the manner described above, a plurality of coaxially aligned electrode layers $316_1$, $316_2$, $316_3$ are formed within the ceramic body 300. Similarly, a plurality of coaxially aligned electrodes $310_1$, $310_2$, and $310_3$ are formed in the ceramic body 300. The electrodes 316 are laterally displaced from the electrodes 310. The two sets of electrodes are interconnected by bus 308. The bus is formed by silk screening a conductive trace upon one of the ceramic layers that forms the ceramic body such that one end of the trace forms an electrode in one set of electrodes and the other end of the trace forms an electrode in the other set of electrodes. As such, the bus 308 interconnects the two sets of electrodes 316 and 310. Once the layers of ceramic and conductive trace/regions are assembled, the body is baked and sintered to cure the ceramic into a unitary ceramic body.

Once cured, a plurality of conductive vias $312_1$, $312_2$, $312_3$ and $312_4$ are formed vertically into the ceramic body to interconnect the electrodes 310. Similarly, the electrodes 316 are interconnected by vias $314_1$, $314_2$, $314_3$ and $314_4$. The surfaces 318 and 320 of the ceramic body, 300 are lapped to expose the vias 314 and 312. Thereafter, electrodes 108 and 322 are deposited upon the surfaces of the ceramic body 300 using conventional metalization techniques. Then, an electrical contact pin 324 is braised or soldered to the conductive pad 322. As such, when electrical current is applied to pin 324, that current flows to the electrode 108 through the offset feedthrough 302.

Of course, rather than utilize a surface mounted pin 324, a conductive pin 214 of FIG. 2 could be substituted for the surface mounted pin 324. Furthermore, a pin, surface mount or not, could be used on the vacuum side of the ceramic body.

By fabricating and using the invention as described, the integrity of a vacuum on one side of a ceramic body is maintained although electrical currents can be supplied through the ceramic body. This technique for creating a feedthrough extending through a ceramic body is applicable to any ceramic body, however, it has particular importance to ceramic wafer support pedestals including those that contain electrostatic chucks and/or ceramic heaters.

There has thus been shown and described a novel apparatus for providing a feedthrough connection through a ceramic body. Many changes, modifications, variations and other uses and applications of the subject invention will, however, become apparent to those skilled in the art after considering the specification and the accompanying drawings which disclose the embodiments thereof. All such changes, modifications, variations and other uses and applications which do not depart from the spirit and the scope of the invention are deemed to be covered by the invention, which is to be limited only by the claims which follow.

What is claimed is:

1. A conductive feedthrough for a body comprising:
   a body having a first side and a second side, where atmospheres respectively contacting said first and second sides are at different atmospheric pressures;
   an electrode embedded within said body;
   a first conductor extending partially through said body from said first side of said body and intersecting the electrode; and
   a second conductor extending partially through said body from said second side of said body and intersecting the electrode wherein said electrode further comprises a plurality of parallel spaced-apart electrodes, where said first conductor intersects the plurality of electrodes and said second conductor intersects at least one of said electrodes in said plurality of electrodes.

2. The conductive feedthrough of claim 1 wherein said first conductor is a conductive via.

3. The conductive feedthrough of claim 1 wherein said second conductor comprises:
   a bore through at least one of said electrodes; and
   a conductive pin having an extension that is positioned within said bore and conductively affixed to the at least one electrode through which the bore passes.

4. The conductive feedthrough of claim 1 wherein the first conductor is laterally offset from the second conductor.

5. The conductive feedthrough of claim 1 wherein the first conductor is aligned with the second conductor along a common axis.

6. The conductive feedthrough of claim 1 wherein the body is a wafer support pedestal.

7. The conductive feedthrough of claim 1, wherein an atmosphere contacting said first side is a vacuum and an atmosphere contacting said second side is at a pressure of approximately one atmosphere.

8. The conductive feedthrough of claim 1 wherein said body is made of ceramic.

9. The conductive feedthrough of claim 8 wherein said electrode comprises a plurality of parallel spaced-apart electrodes, where said first conductor intersects the plurality of electrodes and said second conductor intersects at least one of said electrodes in said plurality of electrodes.

10. The conductive feedthrough of claim 8 wherein the body is a ceramic wafer support pedestal.

11. The conductive feedthrough of claim 8 wherein the first conductor is aligned with the second conductor along a common axis.

12. A conductive feedthrough for a body comprising:
    a body having a first side and a second side, where atmospheres respectively contacting said first and second sides are at different atmospheric pressures;
    a first plurality of parallel, spaced apart electrodes embedded within said body;
    a first conductor extending partially through said body from said first side of said body and interconnecting the plurality of electrodes;
    a second plurality of parallel, spaced apart electrodes embedded within said body;
    second conductor extending partially through said body from said second side of said body and intersecting at least one of the electrodes; and
    a conductive trace, imbedded within the body, having a first end intersected by said first conductor and a second end intersected by said second conductor;
    wherein said feedthrough makes an electrical connection between said first side and said second side.

13. The conductive feedthrough of claim 12 wherein said first conductor is a conductive via.

14. The conductive feedthrough of claim 12 wherein said second conductor comprises:
    a bore through at least one of said electrodes; and
    a conductive pin having an extension that is positioned within said bore and conductively affixed to the at least one electrode through which the bore passes.

15. The conductive feedthrough of claim 12 wherein the first conductor is laterally offset from the second conductor and the conductive trace interconnects the first and second conductors.

16. The conducive feedthrough of claim 12 wherein the body is a wafer support pedestal.

17. The conductive feedthrough of claim 12 wherein said body is made of ceramic.

18. The conductive feedthrough of claim 12, wherein an atmosphere contacting said first side is a vacuum and an atmosphere contacting said second side is at a pressure of approximately one atmosphere.

* * * * *